US012685198B2

(12) United States Patent
Chen et al.

(10) Patent No.: US 12,685,198 B2
(45) Date of Patent: Jul. 14, 2026

(54) SEMICONDUCTOR CHIPLET DEVICE AND INTERPOSER

(71) Applicants: GLOBAL UNICHIP CORPORATION, Hsinchu City (TW); TAIWAN SEMICONDUCTOR MANUFACTURING COMPANY, LTD., Hsinchu (TW)

(72) Inventors: Liang-Kai Chen, Hsinchu City (TW); Chih-Chiang Hung, Hsinchu City (TW); Wen-Yi Jian, Hsinchu City (TW); Yuan-Hung Lin, Hsinchu City (TW); Sheng-Fan Yang, Hsinchu City (TW)

(73) Assignees: GLOBAL UNICHIP CORPORATION, Hsinchu City (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 343 days.

(21) Appl. No.: 18/610,292

(22) Filed: Mar. 20, 2024

(65) Prior Publication Data

US 2025/0105163 A1 Mar. 27, 2025

(30) Foreign Application Priority Data

Sep. 25, 2023 (TW) ................................. 112136574

(51) Int. Cl.
| | |
|---|---|
| *H10W 70/65* | (2026.01) |
| *H10W 70/60* | (2026.01) |
| *H10W 70/63* | (2026.01) |
| *H10W 70/685* | (2026.01) |
| *H10W 90/00* | (2026.01) |

(52) U.S. Cl.
CPC .......... *H10W 70/65* (2026.01); *H10W 70/611* (2026.01); *H10W 70/635* (2026.01); *H10W 70/685* (2026.01); *H10W 90/00* (2026.01); *H10W 90/724* (2026.01)

(58) Field of Classification Search
None
See application file for complete search history.

(56) References Cited

U.S. PATENT DOCUMENTS

| | | | |
|---|---|---|---|
| 10,192,833 B2 | 1/2019 | Kuo et al. | |
| 2023/0144129 A1* | 5/2023 | Yang ..................... | H10W 70/65 257/690 |

FOREIGN PATENT DOCUMENTS

| | | |
|---|---|---|
| TW | 1780980 B | 10/2022 |
| TW | 202320279 A | 5/2023 |

* cited by examiner

*Primary Examiner* — Anthony Ho
(74) *Attorney, Agent, or Firm* — CKC & Partners Co., LLC

(57) ABSTRACT

A semiconductor chiplet device includes a first die, a second die, a decoupling circuit and an interposer. The interposer includes a plurality of power traces and a plurality of ground traces. The first die and the second die are arranged on a first side of the interposer according to a configuration direction, and are coupled to the power traces and the ground traces. The decoupling circuit is arranged on a second side of the interposer, and is coupled to the power traces and the ground traces. The power traces and the ground traces are staggered with each other, and an extending direction of the ground traces and the power traces is the same as the configuration direction.

20 Claims, 6 Drawing Sheets

SEMICONDUCTOR CHIPLET DEVICE AND INTERPOSER

CROSS-REFERENCE TO RELATED APPLICATION

This application claims priority to Taiwan Application Serial Number 112136574, filed Sep. 25, 2023, which is herein incorporated by reference in its entirety.

BACKGROUND

Technical Field

The present disclosure relates to a semiconductor structure, and in particular to a semiconductor chiplet device and an interposer.

Description of Related Art

With the development of high performance computing (HPC) and artificial intelligence (AI) technologies, there is an increasing demand for three-dimensional chips and small chiplets. Die-to-Die is one of the important technologies for semiconductor chip packaging. System On Chip can be assembled from multiple small modules to form a multi-chiplet module.

SUMMARY

One aspect of the present disclosure is a semiconductor chiplet device, comprising a first die, a second die, a decoupling circuit and an interposer. The interposer comprises a plurality of power traces and a plurality of ground traces. The first die and the second die are arranged on a first side of the interposer according to a configuration direction, and are coupled to the plurality of power traces and the plurality of ground traces. The decoupling circuit is arranged on a second side of the interposer, and is coupled to the plurality of power traces and the plurality of ground traces. The plurality of power traces and the plurality of ground traces are staggered with each other, and an extending direction of the plurality of ground traces and the plurality of power traces is the same as the configuration direction.

Another aspect of the present disclosure is an interposer, comprising a plurality of trace layers, a plurality of ground traces and a plurality of power traces. The plurality of ground traces arranged in at least one of the plurality of trace layers, and is coupled to a first die, a second die and a decoupling circuit. The first die and the second die are arranged on a first side of the interposer according to a configuration direction, and the decoupling circuit is arranged on a second side of the interposer. The plurality of power traces is arranged in at least one of the plurality of trace layers, and coupled to a first die, a second die and a decoupling circuit. The plurality of power traces and the plurality of ground traces are staggered with each other, and an extending direction of the plurality of ground traces and the plurality of power traces is the same as the configuration direction.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
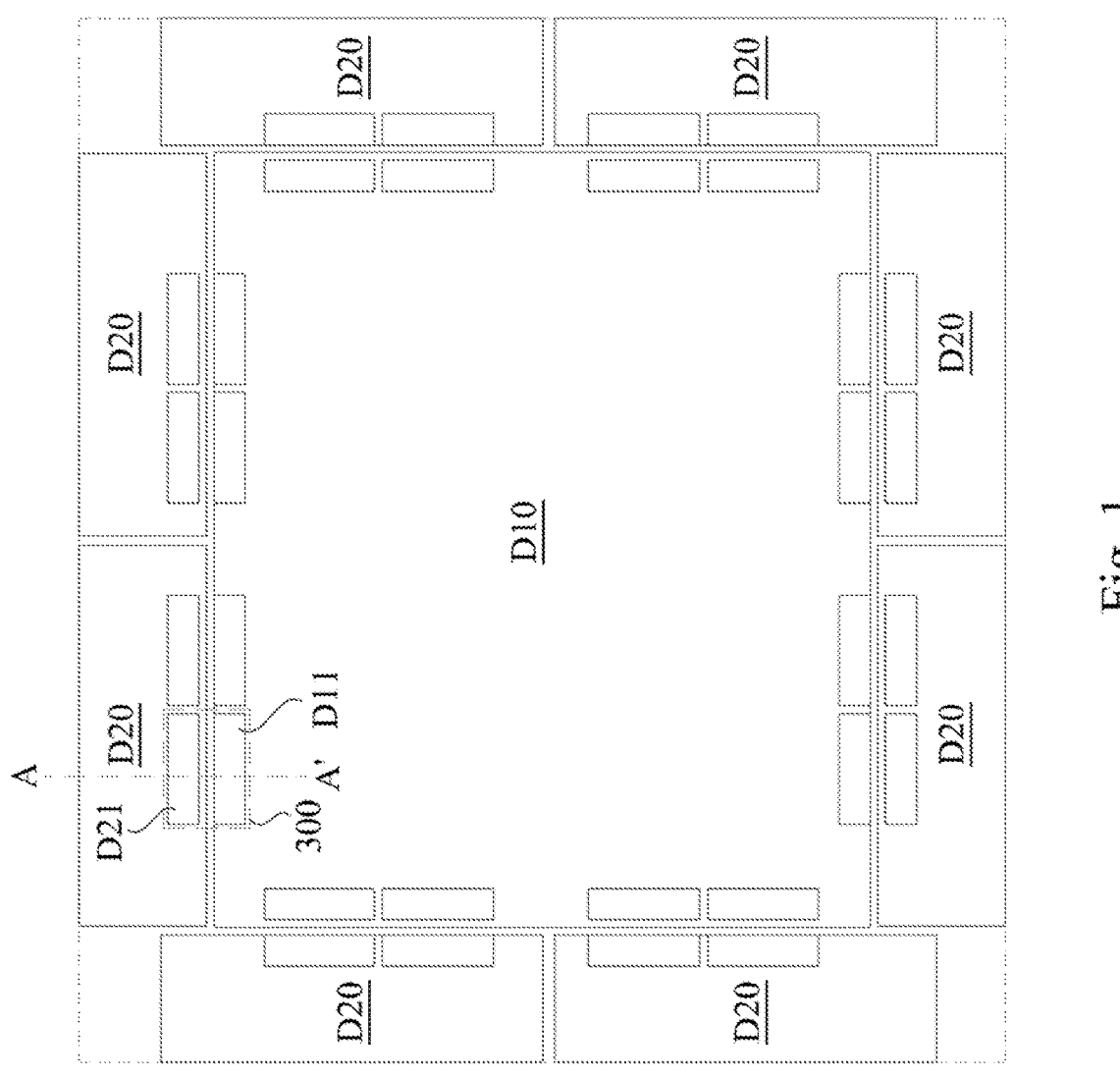
FIG. 1 is a schematic diagram of a semiconductor chiplet device in some embodiments of the present disclosure.

FIG. 1 is a schematic diagram of a semiconductor chiplet device 100 in some embodiments of the present disclosure. The semiconductor chiplet device 100 includes a first die D10 and at least one second die D20. In one embodiment, the first die D10 can be a main die or SOC (System on a Chip), and the second die D20 can be a chiplet or a slave die in a dual main die architecture. The first die D10 and the second die D20 repectively has a first connection interface D11 and a second connection interface D21. The first connection interface D11 and the second connection interface D21 is configured to transmit data between the first die D10 and the second die D20 to form a package interconnection transmission network between semiconductor chiplets.

The above first connection interface D11 and the second connection interface D21 can be a transmitter/receiver interface (Transmitter/Receiver interface phy) in the die. In FIG. 1, each die has multiple connection interfaces, but in other embodiments, the die can also be connected to other the die through only one connection interface. In one embodiment, the semiconductor chiplet device 100 has a decoupling area 300. In one embodiment, the decoupling area 300 is arranged between two connection interfaces D11 and D21. In other embodiments, a vertical projection of the decoupling area 300 facing the connection interfaces D11, D21 covers (includes) the connection interfaces D11 and D21. By arranging the decoupling capacitor on the decoupling area 300, the power integrity and power supply quality of the semiconductor chiplet device 100 can be improved.

Figure 2:
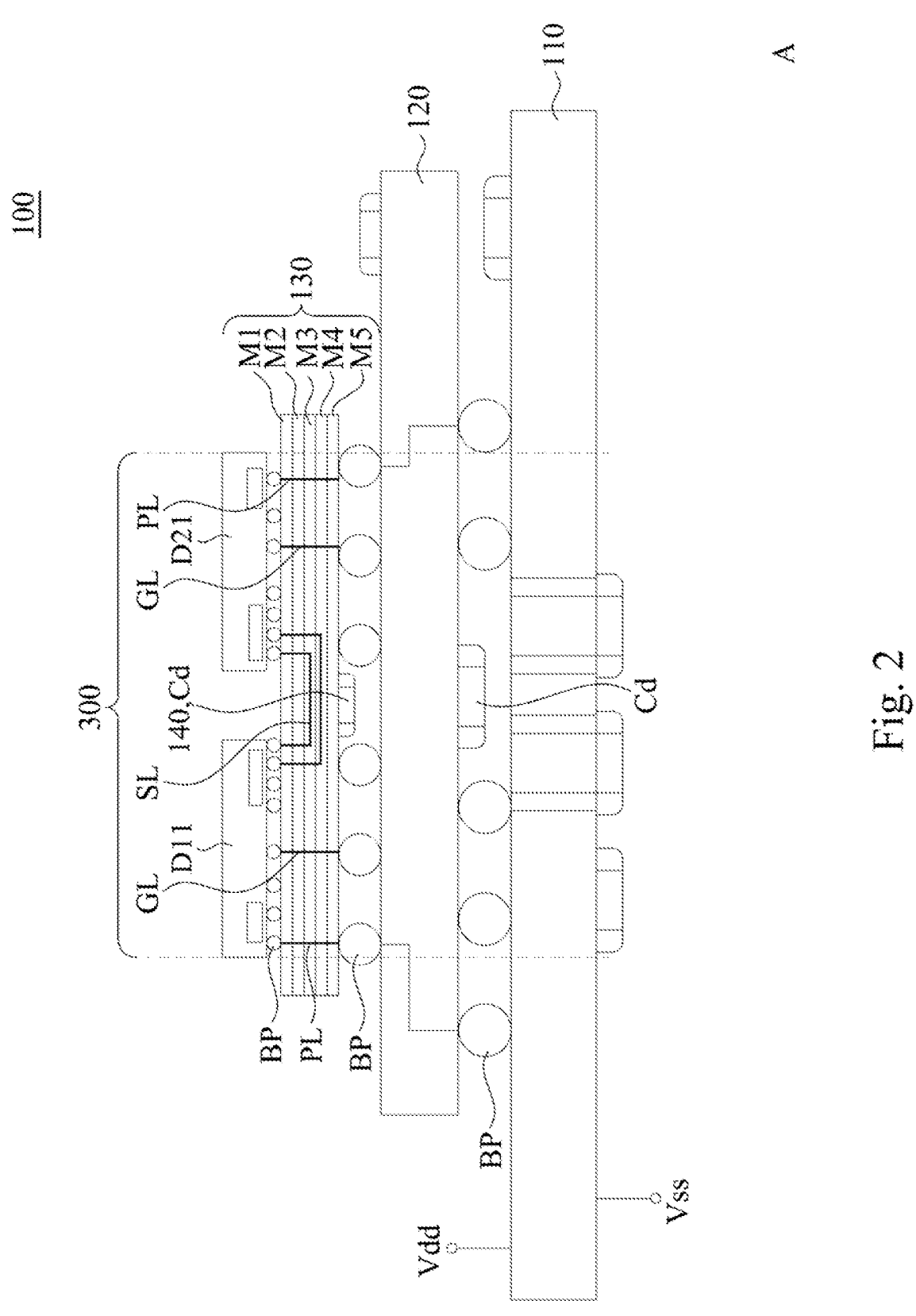
FIG. 2 is a partial schematic diagram of a semiconductor chiplet device in some embodiments of the present disclosure.

FIG. 2 is a partial schematic diagram of a semiconductor chiplet device 100 in some embodiments of the present disclosure. The diagram corresponds to the position of a section line A-A' of the semiconductor chiplet device 100 in FIG. 1. For the convenience of explanation, FIG. 2 only shows the first connection interface D11 on the first die D10 and the second connection interface D21 on the second die D20.

As shown in FIG. 1 and FIG. 2, the semiconductor chiplet device 100 is arranged on a circuit board 110, and includes a first die D10, a second die D20, a packaging substrate 120, an interposer 130 and a decoupling circuit 140. The circuit board 110 is coupled to a first power input terminal Vdd and a second power input terminal Vss (e.g., ground). The first power input terminal Vdd is configured to supply power to the first die D10 and the second die D20 in the semiconductor chiplet device 100. It is important to mention here that the first power input terminal Vdd and the second power input terminal Vss refer to nodes connected to a specific potential.

In one embodiment, the interposer 130 is coupled to dies D10/D20 and the packaging substrate 120 through multiple bumps BP respectively. Furthermore, the interposer 130 is coupled to dies D10/D20 through multiple µBumps, and is coupled to the packaging substrate 120 through the "C4 bump". In addition, the packaging substrate 120 and the circuit board 110 are connected to each other through ball grid array packaging solder balls (BGA balls).

A first side of the interposer 130 (e.g., the upper side shown in FIG. 2) is configured to be arranged and coupled to the first die D10 and the second die D20 (as mentioned before, FIG. 2 only shows the first connection interface D11 of the first die D10 and the second connection interface D21 of the second die D20). A second side (e.g., the lower side shown in FIG. 2) of the interposer 130 is configured to arranged and coupled to the packaging substrate 120. The first die D10 and the second die D20 are coupled to the first power input terminal Vdd through the interposer 130, the packaging substrate 120 and the circuit board 110 respectively to receive power. In this way, the first die D10 and the second die D20 can transmit data to each other through the first connection interface D11, the interposer 130 and the second connection interface D21.

Specifically, the material of the interposer 130 may be silicon interposer, in which multiple layers of wires (traces) are disposed. Wires (traces) are configured to connect electronic signals between dies, and can be connected to external bumps through Through-Silicon Via (TSV) and wire carriers to achieve a connection between the die and the packaging substrate. The structure of traces of interposer 130 will be detailed in subsequent paragraphs.

The decoupling circuit 140 is arranged on the interposer 130 at a position corresponding to the decoupling area 300. In one embodiment, the second side of the interposer 130 is coupled to the decoupling circuit 140. In other embodiments, the decoupling circuit 140 is located in the vertical projection area of the first connection interface D11, in the vertical projection area of the second connection interface D21, or located in an area between the first die D10 and the second die D20. The "vertical projection area" mentioned here refers to the area of the first connection interface D11 or the second connection interface D21 projected to the second side of the interposer 130.

In one embodiment, the decoupling circuit 140 includes at least one decoupling capacitor Cd. The first connection interface D11 and/or the second connection interface D21 coupled to the decoupling capacitor Cd, a first power input terminal Vdd and a second power input terminal Vss through traces of the interposer 130 to form a power distribution network (PDN). In other embodiments, the packaging substrate 120 may also be provided with one or more additional decoupling capacitors Cd, and the location is not limited to the decoupling area 300.

When the semiconductor chiplet device 100 operates at high frequency, the inductive traces of the interposer 130 increase the impedance of the power distribution network, and produces a high voltage drop in the power distribution network, thereby affecting the power supply stability of the semiconductor chiplet device 100. By the decoupling performance of the decoupling circuit 140, the impedance of the power distribution network generated due to high-frequency operation can be reduced, thereby ensuring the power supply stability of the semiconductor chiplet device 100.

Figure 3:
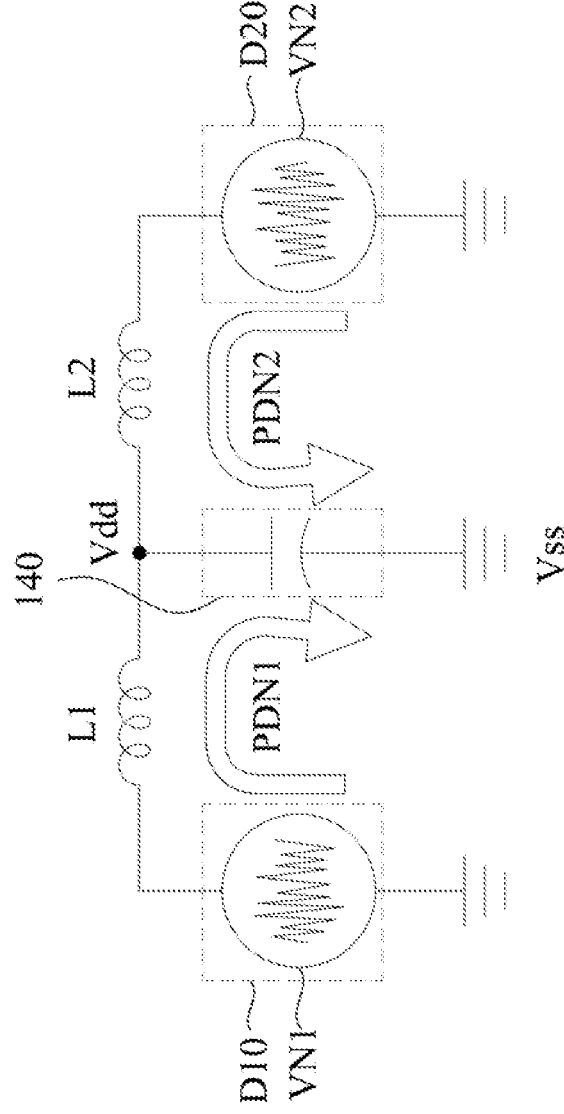
FIG. 3 is an equivalent circuit of a partial schematic diagram of a semiconductor chiplet device in some embodiments of the present disclosure.

In addition to using the decoupling capacitor to ensure the power supply quality, in some embodiments of the present disclosure, the traces structure of the interposer 130 can be designed to shorten the distance of inductive traces between "the first connection interface D11 or the second connection interface D21 coupled to the decoupling circuit 140", thereby reducing the impedance of the power distribution network. FIG. 3 is an equivalent circuit of a partial schematic diagram of a semiconductor chiplet device 100 in some embodiments of the present disclosure. As shown in FIG. 3, the first die D10, the inductor L1, the first power input terminal Vdd, the decoupling circuit 140(e.g., the decoupling capacitor Cd shown in FIG. 2) and the second power input terminal Vss form a first power distribution network PDN1, wherein the inductor L1 represents first traces of the interposer 130. The second die D20, the inductor L2, the first power input terminal Vdd, the decoupling circuit 140 and the second power input terminal Vss form a second power distribution network PDN2, wherein the inductor L2 represents second traces of the interposer 130. Accordingly, the first power input terminal Vdd supplies power to the first die D10 through the first power distribution network PDN1, and supplies power to the second die D20 through the second power distribution network PDN2.

The present disclosure designs the structure of the traces of the interposer 130 to reduce the inductor L1 in the first power distribution network PDN1. So that the voltage noise VN1 caused by the inductor L1 can be effectively reduced during high-frequency operation, thereby ensuring the power supply stability of the first die D10. Similarly, by reducing the inductor L2 in the second power distribution network PDN2, the voltage noise VN2 caused by the inductor L2 can be effectively reduced during high-frequency operation, thereby ensuring the power supply stability of the second die D20.

Accordingly, in order to ensure the power supply stability of the semiconductor chiplet device 100, by designing the structure of the traces of the interposer 130 to reduce the inductors L1 and L2, the usage of the decoupling circuit 140 can be further reduced accordingly (e.g., reduce the capacitor value, or reduce the number of capacitors configured). Therefore, the size of the semiconductor chiplet device 100 can be simplified, and the circuit cost can be reduced.

Figure 4:
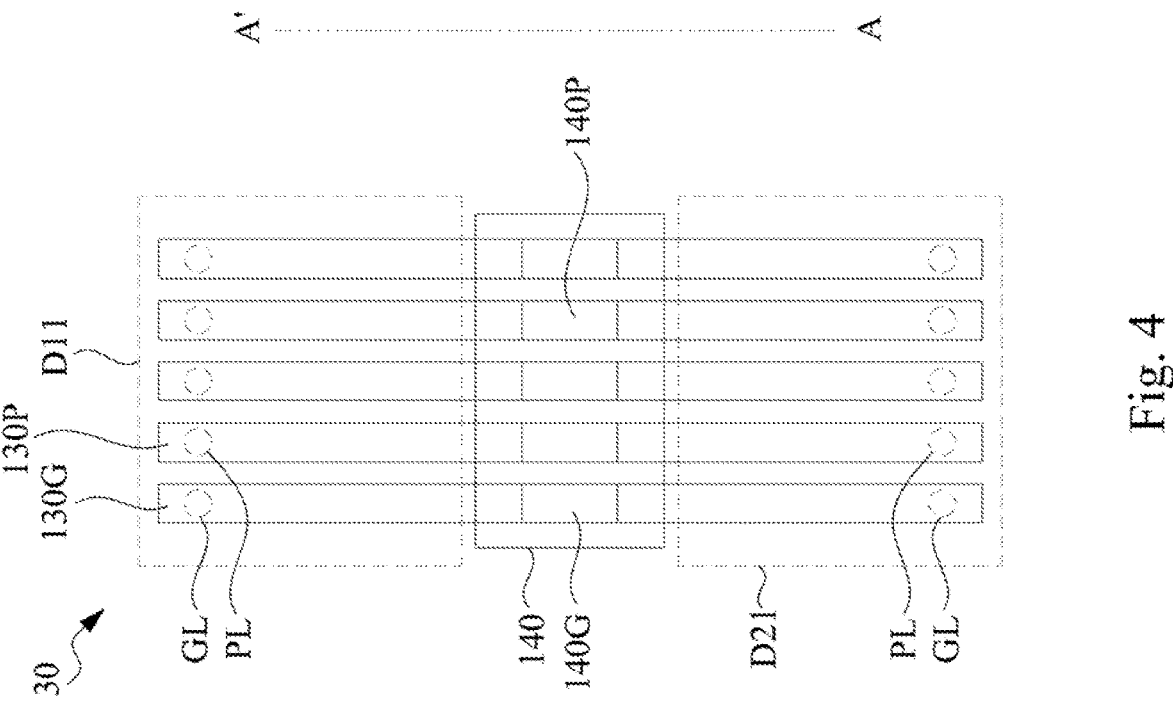
FIG. 4 is a wiring structure of an interposer in some embodiments of the present disclosure.

Referring to FIGS. 1, 2, 4, the traces structure of the interposer 130 is explained here. As shown in FIG. 2, in one embodiment, the interposer 130 includes one or more power transmission lines PL, one or more ground transmission lines GL and one or more signal transmission lines SL. The signal transmission line SL is configured to couple to the first die D10 and the second die D20 for data transmission. The power transmission line PL passes through the interposer 130, and is coupled to the first die D10 or the second die D20. The ground transmission line GL passes through the interposer 130, and is coupled to the first die D10 or the second die D20. In addition, the power transmission line PL and the ground transmission line GL are respectively coupled to the first power input terminal Vdd and the second power input terminal Vss through the packaging substrate 120 and the circuit board 110 as a power supply path for the first die D10 and the second die D20.

FIG. 4 is a wiring structure of an interposer 130 in some embodiments of the present disclosure. The interposer 130 includes multiple power traces 130P and multiple ground traces 130G. Each of the power traces 130P is coupled to at least one power transmission line PL, and is coupled to the decoupling circuit 140. Similarly, each of the ground traces 130G is coupled to at least one ground transmission line GL, and is coupled to the decoupling circuit 140. Referring to FIG. 2 and FIG. 4, a configuration direction of the power transmission line PL and a configuration direction of the plurality of power traces 130P are substantially perpendicular to each other, and a configuration direction of the ground transmission line GL and a configuration direction of the plurality of ground traces 130G are substantially perpendicular to each other. In other words, the power traces 130P and the ground traces 130G can be set in a direction of the section line A-A' in FIG. 2.

In one embodiment, the interposer 130 is provided with multiple trace layers M1-M5, the first trace layer M1 is a top layer of the interposer 130, and is configured to couple to the first die D10 and the second die D20. The fifth trace layer M5 is a bottom layer of the interposer 130, and is configured to couple to the packaging substrate 120. In this embodiment, the ground traces 130G and the power traces 130P are arranged on the fifth trace layer M5, and may be exposed on one side of the interposer 130 facing the packaging substrate 120 (e.g., the second side in the previous embodiment). However, the trace structure of each of the trace layers M1-M5 in the interposer 130 may be different, and the trace structure of each of the trace layers M1-M5 may be interchangeable. In other words, the traces structure shown in FIG. 4 can be changed to be set at anyone of the trace layers M1-M5.

The power transmission line PL and the ground transmission line GL pass through and are coupled to at least one layer of the trace layers M1-M5 (e.g., through via). The power transmission line PL is coupled to at least one power trace 130P. The ground transmission line GL is coupled to at least one ground trace 130G. In addition, the decoupling circuit 140 is coupled to at least one power trace 130P and at least one ground trace 130G.

In one embodiment, an extending direction of the ground traces 130G and an extending direction of the power traces 130P is the same as a configuration direction of the first die D10 and the second die D20 arranged on the interposer 130 (as a direction of the section line A-A' shown in FIG. 1 and FIG. 4), and the ground traces 130G and the power traces 130P are staggered with each other. In other words, every two power traces 130P are separated by at least one ground trace 130G.

The decoupling circuit 140 is provided with multiple ground contacts 140G and multiple power contacts 140P, and is configured to couple to the ground traces 130G and the power traces 130P. The ground contacts 140G and the power contacts 140P are staggered with each other, and an arrangement direction of the ground contacts 140G and an arrangement direction of the power contacts 140P (e.g., the direction from left to right in FIG. 4) is the same as an arrangement direction of the ground traces 130G and an arrangement direction of the power traces 130P.

As shown in FIG. 4, in one embodiment, there is substantially no excessive turning between an extending direction of the ground traces 130G and an extending direction of the power traces 130P, such as a turning of more than 90 degrees. Therefore, a connection distance between the connection interface D11/D21 and the decoupling circuit 140 can be the shortest.

Figure 5:
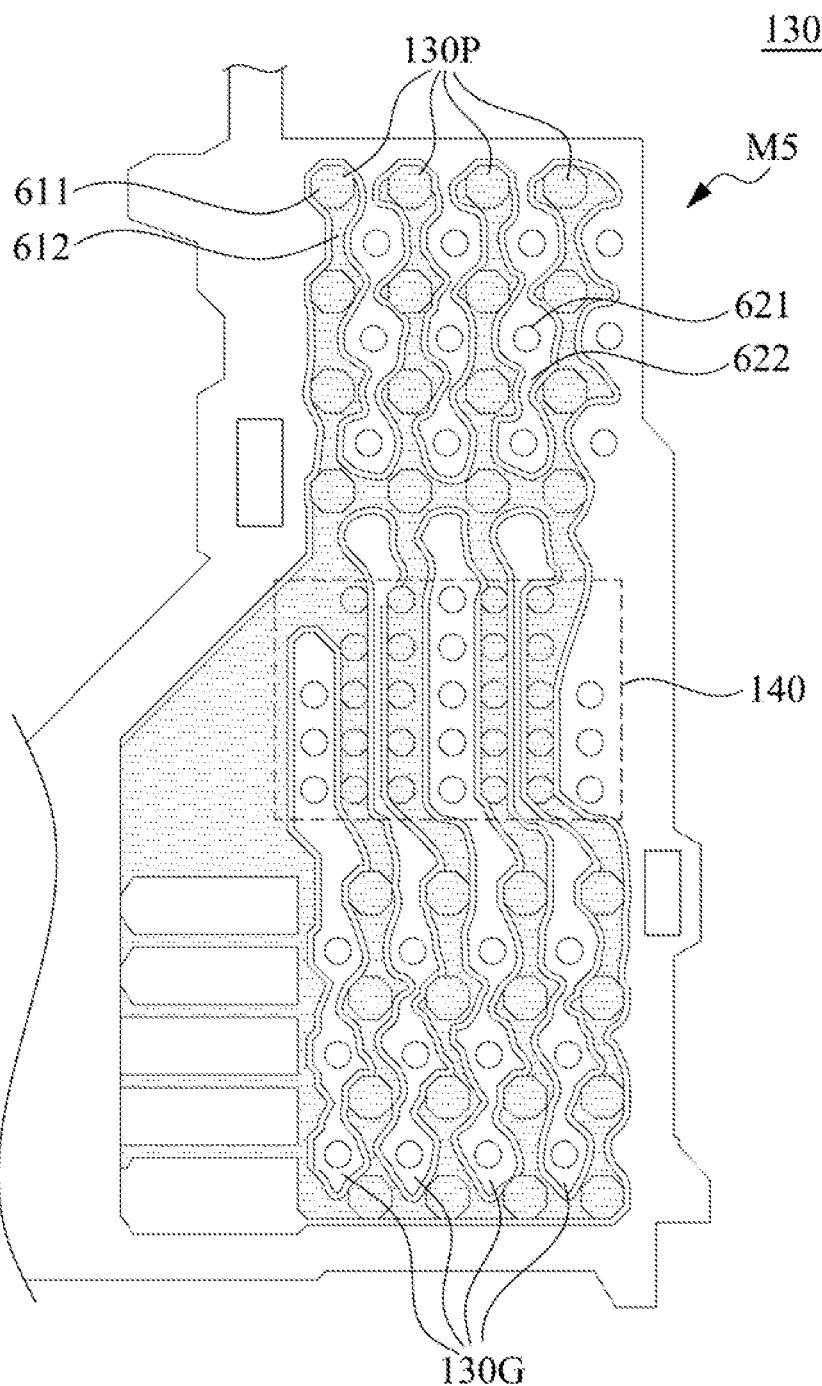
FIG. 5 is a wiring structure of an interposer in some embodiments of the present disclosure.

FIG. 5 is a wiring structure of an interposer 130 in some embodiments of the present disclosure. In this embodiment, the power traces 130P in the trace layer M5 are coupled to at least one power transmission line PL (as shown in FIG. 2 and FIG. 4) and the decoupling circuit 140 respectively. The ground traces 130G in the trace layer M5 are separated into multiple parts and are coupled to the decoupling circuit 140 and at least one ground transmission line GL (as shown in FIG. 2 and FIG. 4). In addition, the power traces 130P and the ground traces 130G in the trace layer M5 are connected to the other trace layers M1-M4 through the power transmission line PL and the ground transmission line GL respectively.

Referring to FIG. 2 and FIG. 5, each of the power traces 130P further includes multiple power coupling portions 611 and multiple power connection portions 612. The power coupling portions 611 is configured to couple to at least one power transmission line PL, or is configured to set the bump BP to couple to the packaging substrate 120 or the decoupling circuit 140. In addition, the two corresponding power coupling portions 611 on two adjacent ones of the power traces 130P are arranged side by side and correspondingly. Each of the power connection portions 612 on the power traces 130P is coupled between the two of the power coupling portions 611, and a width of each of the power connection portions 612 is smaller than a width of each of the power coupling portions 611. Accordingly, there is a gap between the power connection portions 612 on two adjacent one of the power traces 130P. In some embodiments, the width is measured along the horizontal direction in FIG. 5.

Similarly, each of the ground traces 130G further includes multiple ground coupling portions 621 and multiple ground connection portions 622. The ground coupling portions 621 is configured to couple to at least one ground transmission line GL, or is configured to set the bump BP to couple to the packaging substrate 120 or the decoupling circuit 140. In addition, the two corresponding ground coupling portions 621 on two adjacent ones of the ground traces 130G are arranged side by side and correspondingly. Each of the ground connection portions 622 on the ground traces 130G is coupled between the two of the ground coupling portions 621, and a width of each of the ground connection portions 622 is smaller than a width of each of the ground coupling portions 621. Accordingly, there is a gap between the ground connection portions 622 on two adjacent one of the ground traces 130G. In some embodiments, the width is measured along the horizontal direction in FIG. 5.

In this embodiment, the ground coupling portions 621 of the ground traces 130G is arranged between a part of the power connection portions 612 arranged on two adjacent ones of the power traces 130P (arranged on a gap between two power connection portions 612). The power coupling portions 611 of the power traces 130P is arranged between a part of the ground connection portions 622 arranged on two adjacent ones of the ground traces 130G (arranged on a gap between two ground connection portions 622). Accordingly, the power traces 130P and the ground traces 130G are staggered with each other, and an extending direction of the power traces 130P (or the ground traces 130G) have substantially no excessive turning (e.g., a turning of more than 30 or 90 degrees). Therefore, a connection distance between the connection interface D11/D21 and the decoupling circuit 140 can be the shortest.

Furthermore, the staggered the power traces 130P and the ground traces 130G will not touch each other. In other words, there is an isolation gap between the ground coupling portions 621 and the corresponding or adjacent power connection portions 612, and an isolation gap is between the ground connection portions 622 and the corresponding or adjacent power coupling portions 611. In one embodiment, the isolation gap between the power traces 130P and the ground traces 130G is between 10-20 microns. In other embodiments, the isolation gap between the power traces 130P and the ground traces 130G is greater than or equal to 15 microns.

Figure 6:
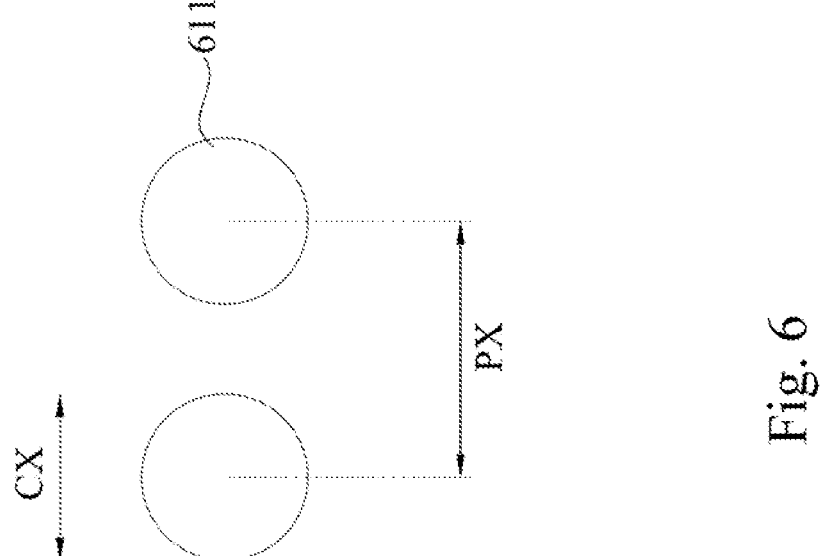
FIG. 6 is a schematic diagram of partial features of a trace layer in some embodiments of the present disclosure.

FIG. 6 is a schematic diagram of partial features of a trace layer in some embodiments of the present disclosure. Referring to FIG. 2, FIG. 5 and FIG. 6, in one embodiment, the power coupling portions 611 and the ground coupling portions 621 are configured to couple to the power transmission line PL and the ground transmission line GL respectively, or are configured to set the bumps BPon the trace layer. Therefore, the area of the power coupling portions 611 and the ground coupling portions 621 corresponds to the area of the bumps (via), such as the circle shown in FIG. 6.

As mentioned above, since the isolation gap must be maintained between the power traces 130P and the ground traces 130G to avoid mutual coupling, in some embodiments, the width set between the power traces 130P and the ground traces 130G may have variations according to actual design, so that there is no excessive turning between an extending direction of the power traces 130P and an extending direction of the ground traces 130G, and a connection distance between the connection interface D11/D21 and the decoupling circuit 140 can be the shortest.

The following takes the power coupling portions 611 as an example for explanation. The diameter of the power coupling portions 611 is CX, and the distance between the centers of two adjacent power coupling portions 611 is PX. In one embodiment, the isolation gap between the power traces 130P and the ground traces 130G remains at least "15 microns." Therefore, a width between two adjacent of the power coupling portions 611 for setting the ground connection portion 622 will be "PX-CX-(15×2)".

As shown in FIG. 5, a width between the two adjacent ones, the power trace 130P and the power coupling portion 611, is greater than a width of the power connection portions 612. The distance between two adjacent power connection portions 612 is greater than the distance between two adjacent power coupling portions 611. Therefore, a ground coupling portion 621 can be arranged between two adjacent power connection portions 612, so that there is substantially no excessive turning between an extending direction of the power traces 130P and an extending direction of the ground traces 130G. That is, the center lines of the power traces 130P and the ground traces 130G remain substantially straight.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A semiconductor chiplet device, comprising:
   a first die;
   a second die;
   a decoupling circuit; and
   an interposer comprising a plurality of power traces and a plurality of ground traces, wherein the first die and the second die are arranged on a first side of the interposer according to a configuration direction, and are coupled to the plurality of power traces and the plurality of ground traces;
   wherein the decoupling circuit is arranged on a second side of the interposer, and is coupled to the plurality of power traces and the plurality of ground traces;
   wherein the plurality of power traces and the plurality of ground traces are staggered with each other, and an extending direction of the plurality of ground traces and the plurality of power traces is the same as the configuration direction.

2. The semiconductor chiplet device of claim 1, wherein the interposer comprises a plurality of trace layers, and at least one of the plurality of trace layers comprises the plurality of power traces and the plurality of ground traces.

3. The semiconductor chiplet device of claim 2, wherein the interposer further comprises:
   a power transmission line passing through the plurality of trace layers, coupled to one of the plurality of power traces, and coupled to the first die or the second die; and
   a ground transmission line passing through the plurality of trace layers, coupled to one of the plurality of ground traces, and coupled to the first die or the second die.

4. The semiconductor chiplet device of claim 3, wherein one of the plurality of power traces comprises:
   a plurality of power coupling portions, wherein at least one of the plurality of power coupling portions is coupled to the power transmission line; and
   a plurality of power connection portions coupled between the plurality of power coupling portions, wherein a width of each of the plurality of power connection portions is smaller than a width of each of the plurality of power coupling portions.

5. The semiconductor chiplet device of claim 4, wherein one of the plurality of ground traces comprises:
   a plurality of ground coupling portions, wherein at least one of the plurality of ground coupling portions is coupled to the ground transmission line; and
   a plurality of ground connection portions coupled between the plurality of ground coupling portions, wherein a width of each of the plurality of ground connection portions is smaller than a width of each of the plurality of ground coupling portions.

6. The semiconductor chiplet device of claim 5, wherein the plurality of ground coupling portions is arranged between two of the plurality of power connection portions arranged on two adjacent ones of the plurality of power traces.

7. The semiconductor chiplet device of claim 6, wherein an isolation gap between the plurality of ground coupling portions and each of the two of the plurality of power connection portions, and the isolation gap is greater than or equal to 15 microns.

8. The semiconductor chiplet device of claim 5, wherein the plurality of power coupling portions is arranged between two of the plurality of ground connection portions arranged on two adjacent ones of the plurality of ground traces.

9. The semiconductor chiplet device of claim 8, wherein an isolation gap between the plurality of power coupling portions and each of the two of the plurality of ground connection portions, and the isolation gap is greater than or equal to 15 microns.

10. The semiconductor chiplet device of claim 3, wherein a direction of the power transmission line and a direction of the plurality of power traces are substantially perpendicular to each other.

11. The semiconductor chiplet device of claim 3, wherein a direction of the ground transmission line and a direction of the plurality of ground traces are substantially perpendicular to each other.

12. The semiconductor chiplet device of claim 1, wherein the decoupling circuit comprises a plurality of ground contacts and a plurality of power contacts, the plurality of ground contacts and the plurality of power contacts are arranged staggered with each other, and an arrangement direction of the plurality of ground contacts and the plurality of power contacts is the same as an arrangement direction of the plurality of ground traces and the plurality of power traces.

13. An interposer, comprising:
a plurality of trace layers;
a plurality of ground traces arranged in at least one of the plurality of trace layers, and coupled to a first die, a second die and a decoupling circuit, wherein the first die and the second die are arranged on a first side of the interposer according to a configuration direction, and the decoupling circuit is arranged on a second side of the interposer; and
a plurality of power traces arranged in at least one of the plurality of trace layers, and coupled to a first die, a second die and a decoupling circuit;
wherein the plurality of power traces and the plurality of ground traces are staggered with each other, and an extending direction of the plurality of ground traces and the plurality of power traces is the same as the configuration direction.

14. The interposer of claim 13, wherein the interposer further comprises:

a power transmission line passing through the plurality of trace layers, coupled to one of the plurality of power traces, and coupled to the first die or the second die; and
a ground transmission line passing through the plurality of trace layers, coupled to one of the plurality of ground traces, and coupled to the first die or the second die.

15. The interposer of claim 14, wherein one of the plurality of power traces comprises:
a plurality of power coupling portions, wherein at least one of the plurality of power coupling portions is coupled to the power transmission line; and
a plurality of power connection portions coupled between the plurality of power coupling portions, wherein a width of each of the plurality of power connection portions is smaller than a width of each of the plurality of power coupling portions.

16. The interposer of claim 15, wherein one of the plurality of ground traces comprises:
a plurality of ground coupling portions, wherein at least one of the plurality of ground coupling portions is coupled to the ground transmission line; and
a plurality of ground connection portions coupled between the plurality of ground coupling portions, wherein a width of each of the plurality of ground connection portions is smaller than a width of each of the plurality of ground coupling portions.

17. The interposer of claim 16, wherein the plurality of ground coupling portions is arranged between two of the plurality of power connection portions arranged on two adjacent ones of the plurality of power traces.

18. The interposer of claim 17, wherein an isolation gap between the plurality of ground coupling portions and each of the two of the plurality of power connection portions, and the isolation gap is greater than or equal to 15 microns.

19. The interposer of claim 16, wherein the plurality of power coupling portions is arranged between two of the plurality of ground connection portions arranged on two adjacent ones of the plurality of ground traces, and an isolation gap between the plurality of power coupling portions and each of the two of the plurality of ground connection portions, and the isolation gap is greater than or equal to 15 microns.

20. The interposer of claim 14, wherein a direction of the power transmission line and a direction of the plurality of power traces are substantially perpendicular to each other.

* * * * *